United States Patent [19]
Schiavo et al.

[11] Patent Number: 5,929,373
[45] Date of Patent: Jul. 27, 1999

[54] HIGH VOLTAGE FEED THROUGH

[75] Inventors: Tony Schiavo, San Mateo; Jeff Brodine, Los Gatos; Dan Marohl, San Jose, all of Calif.

[73] Assignee: Applied Materials, Inc., Santa Clara, Calif.

[21] Appl. No.: 08/880,229

[22] Filed: Jun. 23, 1997

[51] Int. Cl.⁶ .................................................. H05K 5/06
[52] U.S. Cl. .................... 174/17.08; 174/18; 174/50.61; 174/152 GM; 439/559
[58] Field of Search .............................. 174/50.61, 50.63, 174/50.5, 8, 11 BH, 14 BH, 7.08, 18, 17 GF, 152 GM; 439/559

[56] References Cited

U.S. PATENT DOCUMENTS

| | | | |
|---|---|---|---|
| 2,458,748 | 1/1949 | Stupakoff | 174/152 |
| 3,331,913 | 7/1967 | Johnson | 174/52 |
| 4,152,540 | 5/1979 | Duncan et al. | 174/152 GM |
| 4,213,004 | 7/1980 | Acker et al. | 174/151 |
| 4,687,417 | 8/1987 | Amboss | 417/49 |
| 4,694,264 | 9/1987 | Owens et al. | 333/34 |
| 4,841,098 | 6/1989 | Dunton | 174/18 X |
| 5,223,672 | 6/1993 | Pinneo et al. | 174/52.4 |
| 5,348,497 | 9/1994 | Nitescu | 439/824 |
| 5,430,257 | 7/1995 | Lau et al. | 174/151 |

*Primary Examiner*—Dean A. Reichard
*Attorney, Agent, or Firm*—Patterson & Associates

[57] ABSTRACT

A high voltage feed through supplies power to a device through a passage in a wall of a vacuum chamber. The feed through includes a ceramic body comprising a first brazing surface, a second brazing surface, and a central passage for a conductor, a power source connector brazed to the first brazing surface, and a mounting flange brazed to the second brazing surface, wherein the first and second brazing surfaces are positioned to reduce tensile forces on brazed connections. The brazing surfaces are preferably coplanar to reduce the tensile forces, or angled to place residual compressive forces on the brazed connections. The tensile forces on co-planar surfaces are further reduced by brazing ceramic rings to the power source connector and the mounting flange opposite brazed connections to the ceramic body of the feed through.

23 Claims, 4 Drawing Sheets

HIGH VOLTAGE FEED THROUGH

FIELD OF THE INVENTION

The present invention relates to connection of a power source to a device within a vacuum chamber. More particularly, the invention relates to an insulated feed through which transports high voltage through a wall of a vacuum chamber.

BACKGROUND OF THE RELATED ART

Connecting a high voltage power source to a device, such as an electrode, within a vacuum chamber typically involves an insulated feed through which is sealed within a passage through a wall of the chamber. The feed throughs generally combine metal components for strength or conductivity and ceramic components for insulating high voltage conductors from the wall of the chamber. Such feed throughs are useful for a variety of connections, including connections between external power sources and electrical devices within vacuum processing chambers which produce integrated circuits. The feed throughs can be installed in any chamber wall and can seal ambient conditions from high vacuum within the chamber.

The combination of conducting and insulating components in a high voltage feed through typically requires joining of the components to provide a vacuum tight seal and an insulated passage for high voltage conductors. Metal and ceramic components can be joined by brazing with alloys which bond to both the metal components and the ceramic components. The brazed connections provide sufficient vacuum tight seals, however, thermal expansion and contraction of the metal and ceramic components can weaken and break the ceramic components or the brazed connections. Thus, feed throughs which combine metal and ceramic components are typically used in walls which are not heated or cooled substantially during vacuum processing. There remains a need for a high voltage feed through which is resistant to thermal stresses during vacuum processing.

SUMMARY OF THE INVENTION

The present invention provides a high voltage feed through which supplies power to a device through a passage in a wall of a vacuum chamber. The feed through generally includes a ceramic body comprising a first brazing surface, a second brazing surface, and a central passage for a conductor, a power source connector brazed to the first brazing surface, and a mounting flange brazed to the second brazing surface. The first and second brazing surfaces are positioned to reduce tensile forces on the brazed connections during thermal expansion and contraction of the feed through. Thermal stresses are further reduced by brazing ceramic rings to the power source connector and the mounting flange opposite the brazed connections with the first and second brazing surfaces of the ceramic body. The mounting flange preferably centers the feed through in the passage in a chamber wall which separates vacuum conditions from ambient conditions, such as a substrate supporting surface in a semiconductor processing chamber.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

The appended drawings illustrate typical embodiments of this invention and are not to be considered limiting of its scope, for the invention may admit to other equally effective embodiments.

DETAILED DESCRIPTION OF THE INVENTION

Figure 1:
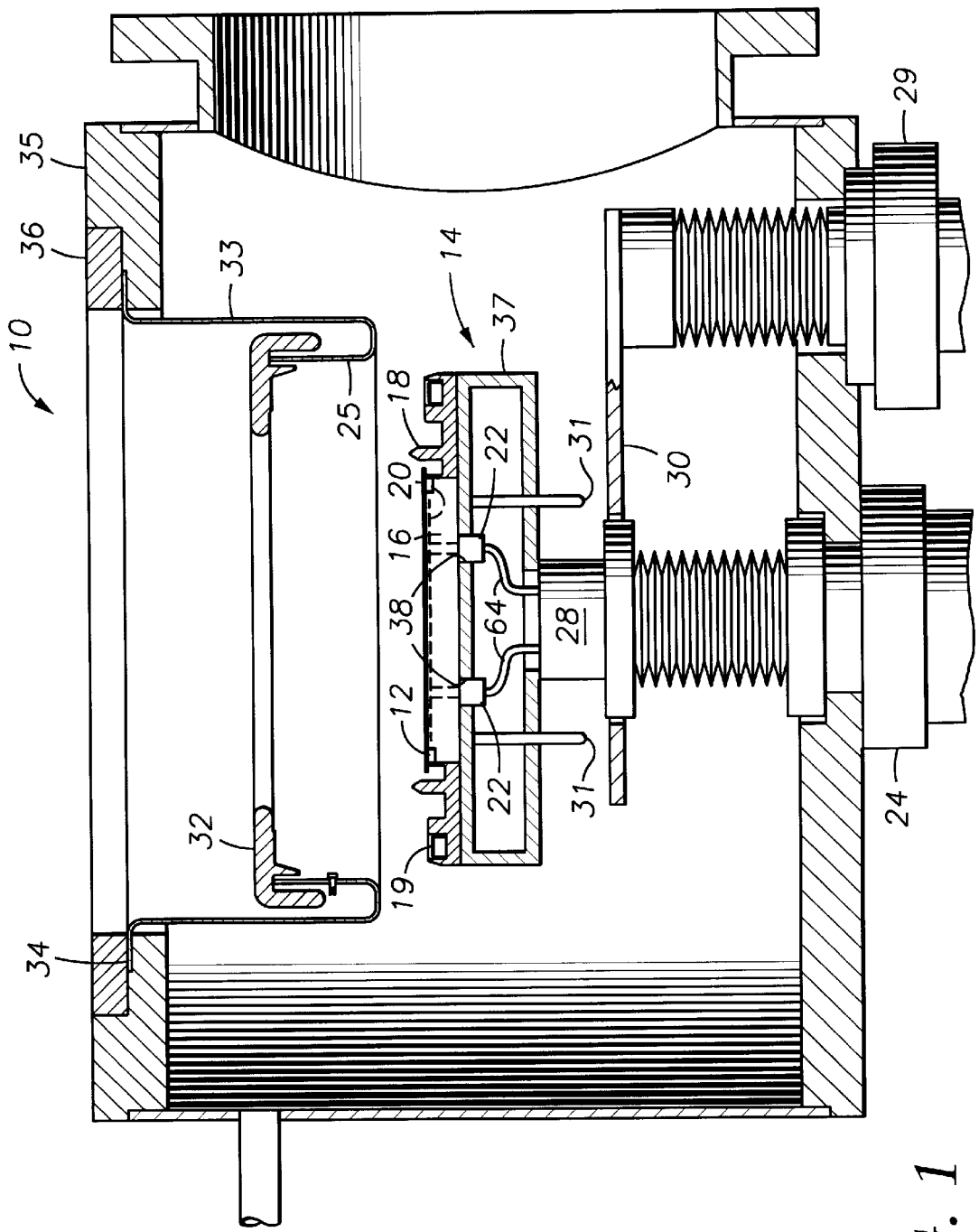
FIG. 1 is a sectional view of a vacuum deposition chamber (without a target assembly) showing an electrode and two high voltage feed throughs within a substrate holder.

The present invention provides a feed through for supplying high voltage power to a device through a passage in a wall of a vacuum chamber such as a semiconductor processing chamber used to fabricate integrated circuits. The feed through preferably connects an external power source, such as an RF or DC source, to an electrode within the vacuum chamber. The feed through combines conductive components as well as insulative components to seal and insulate a conductor within the passage in the wall of the vacuum chamber. Two feed throughs can be used to connect a single device within the vacuum chamber to both an external power source and an external ground.

One embodiment of a feed through of the present invention comprises a ceramic body comprising a first brazing surface, a second brazing surface, and a central passage for a conductor, a power source connector brazed to the first brazing surface, and a mounting flange brazed to the second brazing surface, wherein the first and second brazing surfaces are positioned to reduce tensile forces on ceramic components and brazed connections. The invention will be further described below with reference to specific embodiments shown in the drawings.

As shown in FIG. 1, the present invention preferably provides a high voltage feed through for a semiconductor processing chamber 10 which deposits or etches a material (not shown) on or from a substrate 12. The processing chamber 10 typically includes a substrate support member 14 which positions the substrate 12 within the chamber 10. The substrate support member 14 includes a ceramic puck 16 which receives the substrate and is secured to the support member 14 by a clamp ring 18 which is bolted or otherwise fastened to the support member 14 by bolts 19 or other fastening means. An electrode 20, such as a molybdenum mesh, is embedded in the ceramic puck 16 for biasing the substrate support member 14 to enhance deposition of the target material on the substrate or to hold the substrate in place during processing. The electrode 20 receives high voltage RF or DC power from an external power source (not shown) through power cables 64, and two feed throughs 22 which are shown in more detail in FIG. 2.

The substrate support member 14 is raised or lowered within the chamber 10 by a first lift mechanism 24 which moves a hollow stem 28 that is brazed or otherwise fastened to the support member 14. A second lift mechanism 29 is typically provided to place the substrate 12 on the support member 14, or remove the substrate from the support member. The second lift mechanism 29 raises or lowers a lift arm 30 which engages pins 31 which slide through the support member 14 to raise or lower the substrate 12 relative to the support member 14.

As the support member 14 raises the substrate 12 in the chamber 10, the support member 14 engages a deposition ring 32 which shields the chamber 10 during deposition of the target material onto the substrate. The deposition ring 32 initially rests upon a deposition shield 33 which has a flared end 34 that is held in position between a chamber wall 35 and an adapter plate 36.

To enable passage of the RF, DC, or other power to the electrode 20, conductive elements of the feed through 22 must extend through a chamber wall, but they cannot contact the chamber wall which may be grounded, or, if contacted with the conductor, will become "hot." The support member 14 includes an outer surface 37, preferably made of stainless steel, which is also a wall of the vacuum chamber since the outer surface 37 seals the vacuum chamber from ambient pressure which exists within the support member 14 and within the hollow stem 28. The feed through 22 of the present invention is shown in the drawings as being sealed within passages 38 in the outer surface 37 of the support member 14 below the ceramic puck 16. However, the feed through could be installed in any passage through any wall of the vacuum chamber.

Figure 2:
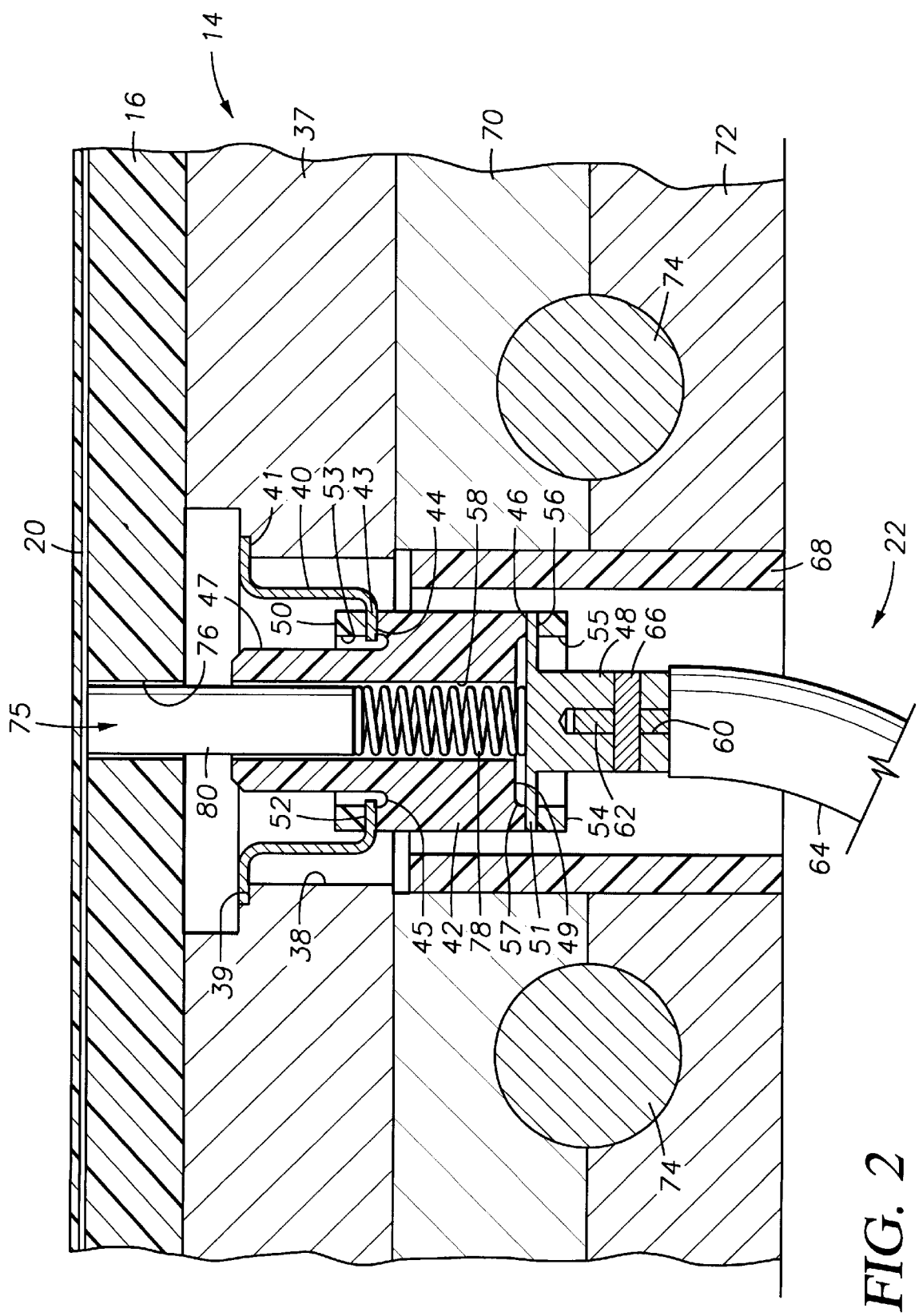
FIG. 2 is a sectional view of a high voltage feed through comprising brazing surfaces that are positioned to reduce thermal stresses during thermal expansion and contraction.

FIG. 2 is a sectional view of a preferred feed through 22 of FIG. 1 which is constructed to reduce thermal stresses during thermal expansion and contraction of the feed through. The feed through includes a mounting flange 40 having an outer rim 41 which is welded or otherwise sealed to an annular ledge 39 within the passage 38 in the outer surface 37 of the support member 14. The mounting flange 40 centers a ceramic body 42 within the passage 38 to provide maximum distance between the passage wall and a biased conductor 75 which is centered in the ceramic body 42. The ceramic body 42 has a first brazing surface 44 which is positioned on the ceramic body for completion of a brazed connection to an inner rim 43 on the mounting flange 40. The first brazing surface 44 is a ring-shaped planar surface which is connected by a rounded corner 45 to an extension 47 of the ceramic body 42 which shields the mounting flange 40 from the biased conductor 75 described in more detail below. The mounting flange 40 is grounded through the outer surface 37 of the support member 14. The rounded corner 45 of the ceramic body reduces thermal stresses which result from any slight variation in thermal expansion co-efficient for the ceramic body 42 and the mounting flange 40.

The ceramic body 42 also has a second brazing surface 46 which is positioned on the ceramic body for completion of a brazed connection to flanged end 51 of a power source connector 48. The second brazing surface 46 is also a ring-shaped planar surface which is connected by a rounded corner 57 to a recessed surface 49 of the ceramic body 42.

The first and second brazing surfaces 44, 46 on the ceramic body 42 are preferably planar and parallel so that expansion and contraction of the feed through does not apply tensile or compressive forces to the brazed connections. Any difference in the co-efficient of thermal expansion for the ceramic body 42 with respect to the power source connector 48 or the mounting flange 40 results in primarily shear stress on the brazed connections. Furthermore, the shear stresses encounter the rounded corners 45, 57 instead of sharp corners which would be more vulnerable to stress cracking.

Tensile and compressive stresses on the brazed connections between the ceramic body 42 and the mounting flange 40 are further reduced by brazing a first ceramic ring 50 having a brazing surface 52 adjacent to the mounting flange 40. The brazing surface 52 has a ring-shaped planar surface similar to the first brazing surface 44 of the ceramic body 42. The first ceramic ring 50 further comprises an inner surface 53 which remains spaced apart from the ceramic body 42 to avoid contact during expansion and contraction of the feed through.

Tensile and compressive stresses on the brazed connections between the ceramic body 42 and the power source connector 48 are further reduced by brazing a second ceramic ring 54 having a brazing surface 56 adjacent to the power source connector 48. The brazing surface 56 has a ring-shaped planar surface similar to the second brazing surface 46 of the ceramic body 42. The second ceramic ring 54 further comprises an inner surface 55 which remains spaced apart from the power source connector 48 to avoid contact during expansion and contraction of the feed through.

The ceramic body 42 includes a central passage 58 through which one or more conductive components extend to convey high voltage from the power source connector 48 to the electrode 20 within the ceramic puck 16. A biased conductor 75 slides within the central passage 58 in the ceramic body 42 and a corresponding hole 76 which exposes the electrode 20 within the ceramic puck 16. The biased conductor 75 preferably comprises a spring 78 which rests against the power source connector 48, and a cylindrical conductor pin 80, preferably made of stainless steel, which is pressed against the electrode 20 by the spring 78.

The power source connector 48 includes a wire slot 60 for insertion of a wire 62 which extends from the power cable 64. The wire 62 is locked within the power source connector by a weld 66. The power cable 64 is connected to the power source connector 48 at ambient pressure. The power source connector 48 is exposed to vacuum conditions through the central passage 58 in the ceramic body 42 and forms a part of the vacuum seal along with the mounting flange 40 and the ceramic body 42.

The mounting flange 40 and the power source connector 48 are preferably constructed of a metal alloy which has a co-efficient of thermal expansion similar to the ceramic body 42. A preferred combination of materials includes Kovar alloy, a nickel alloy, which has a thermal co-efficient close to the thermal co-efficient of Alumina (ceramic). Kovar alloy and Alumina are brazed with a common brazing metal such as pure silver, pure copper, pure gold, or an alloy of copper and gold, preferably the alloy of copper and gold, to maintain vacuum tight seals at temperatures above 600° C. However, other alloys and other ceramics can be used.

As shown in FIG. 2, the power cable 64 is shielded by a ceramic sleeve 68 from copper plates 70, 72 which surround a heating element 74 beneath the outer surface 37 of the substrate support member 14. The power cable 64 is further shielded by its own quartz insulation from metal components within the hollow stem 28 (FIG. 1) which positions the support member 14 within the chamber. The heating element 74 is close to the feed through 22 and causes rapid changes in the thermal expansion and contraction of the feed through components.

The feed through of the present invention provides strong brazed joints which maintain a tight seal after repeated heating and cooling cycles. The feed through minimizes tensile forces on the ceramic components and the brazed connections. Brazing occurs at temperatures above the melting point of the brazing compound which is above the maximum process temperature which may be encountered within the chamber. After brazing, the metal and ceramic components of the feed through contract and residual stresses are formed on the components and the brazed connections. The stresses are reduced when the feed through components are heated to process conditions. However, residual tensile stresses will eventually break ceramic components and pull apart the brazed connections.

Figure 3:
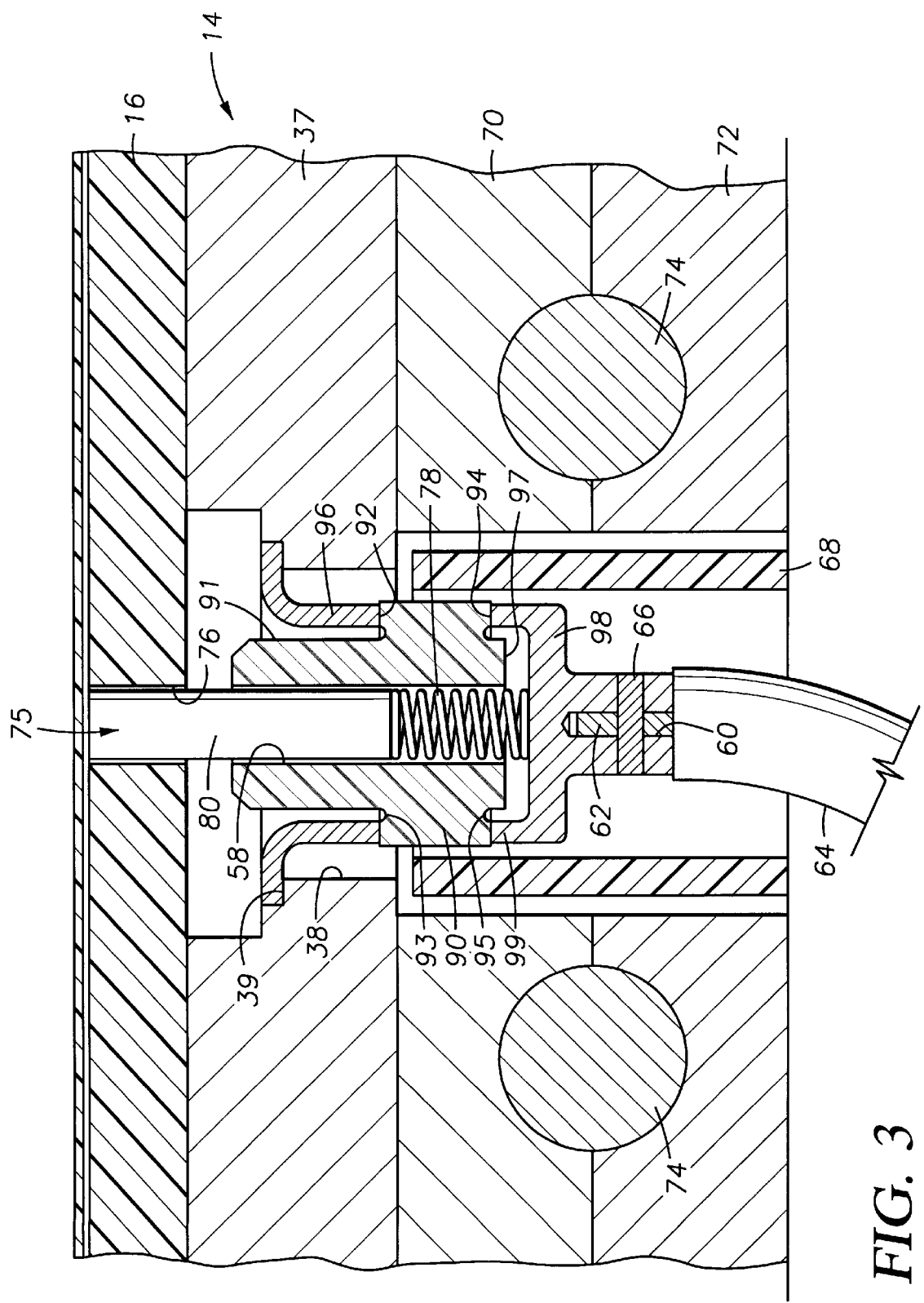
FIG. 3 is a sectional view of an alternative feed through comprising parallel brazing surfaces that are positioned to reduce thermal stresses during thermal expansion and contraction.

FIG. 3 shows an alternative embodiment of a feed through wherein a ceramic body 90 has first and second brazing surfaces 92, 94, which are planar, parallel, and annular surfaces that are adjacent rounded corners 93, 95 as described for the embodiment of FIG. 2. A mounting flange 96 is brazed to the first brazing surface 92, and fits closely around an extension 91 of the ceramic body 90 while touching the ceramic body only through the brazed connections to reduce tensile stresses on the ceramic components. A power source connector 98 has an outer, annular projection 99 which is brazed to the second brazing surface 94, and which fits closely around a raised surface 97 on the ceramic body 90 without touching the ceramic body. The feed through is less resistive to tensile stresses on the brazed connections in comparison to the feed through of FIG. 2 since shear stresses on the first and second brazing surfaces are imbalanced and the imbalance could result in a tensile stress on the brazed connection. However, the feed through of FIG. 3 can be used in a slightly smaller diameter passage in comparison to the feed through of FIG. 2 since the feed through of FIG. 3 does not include the first and second ceramic rings.

Figure 4:
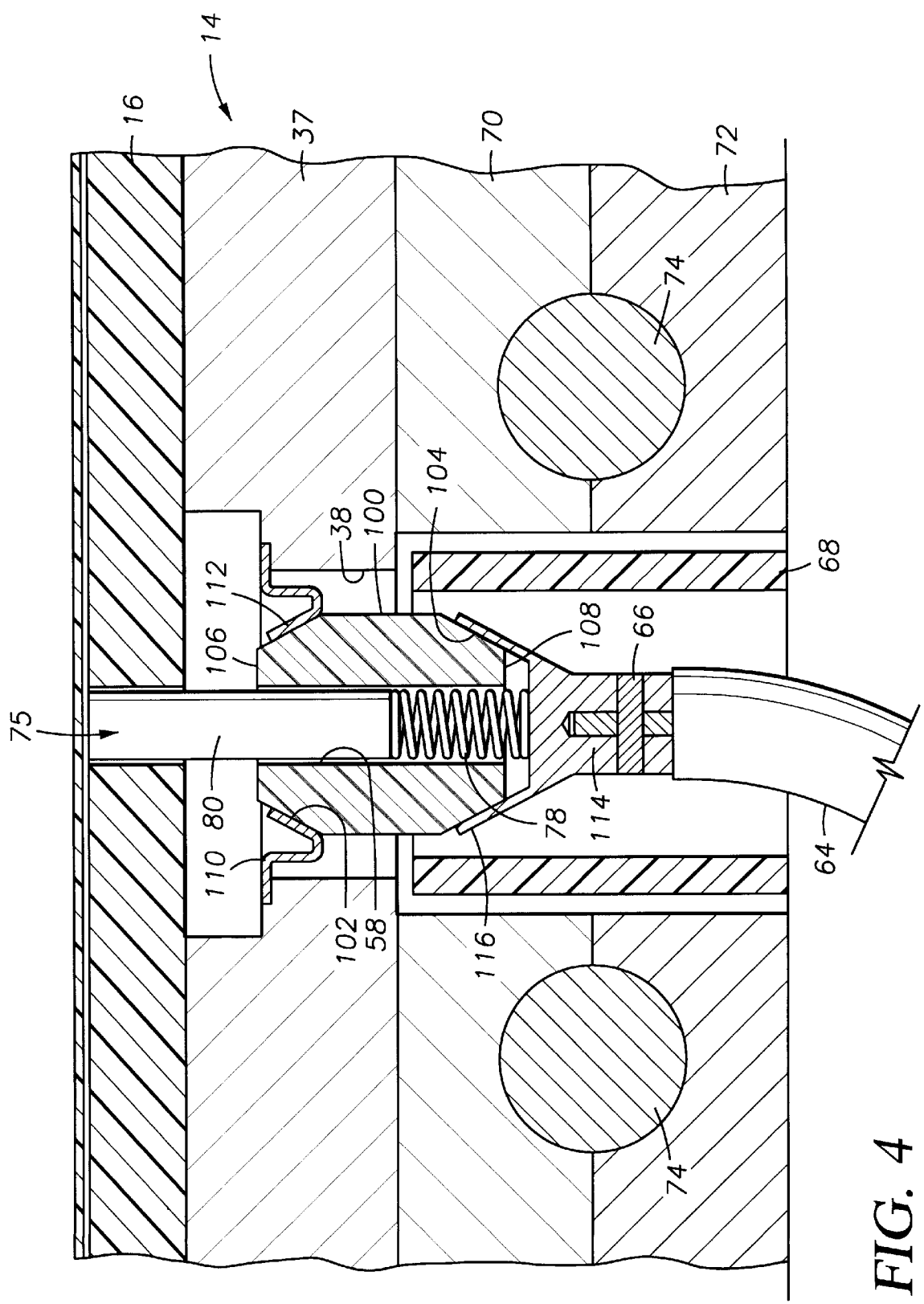
FIG. 4 is a sectional view of an alternative feed through comprising brazing surfaces that are positioned non-parallel to reduce thermal stresses during thermal expansion and contraction.

FIG. 4 shows an alternative embodiment of a feed through wherein a ceramic body 100 has first and second brazing surfaces 102, 104, which are angled, annular surfaces that are adjacent first and second ends 106, 108 of the ceramic body, respectively. A mounting flange 110 having a conical brazing surface 112 is brazed to the first brazing surface 102 of the ceramic body 100. The mounting flange 110 fits closely around the first end 106 of the ceramic body 100. However, expansion and contraction of the mounting flange 110 and the ceramic body 100 produces shear and compressive forces on the brazed connection since the ceramic body 100 is substantially free to move toward the mounting flange 110 to relieve tensile forces. A power source connector 114 has a conical projection 116 which is brazed to the second brazing surface 104 of the ceramic body 100. The power source connector 114 fits closely around the second end 108 of the ceramic body 100 and produces shear and compressive forces on the brazed connection.

While the foregoing is directed to the preferred embodiment of the present invention, other and further embodiments of the invention may be devised without departing from the basic scope thereof. The scope of the invention is determined by the claims which follow.

What is claimed is:

1. A feed through for supplying power to a device through a passage in a wall of a vacuum chamber, the feed through comprising:
   a ceramic body comprising a first brazing surface, a second brazing surface, and a central passage for a conductor;
   a mounting flange brazed to the first brazing surface; and
   a power source connector brazed to the second brazing surface;
   wherein the first and second brazing surfaces are substantially planar.

2. The feed through of claim 1, wherein the first and second brazing surfaces of the ceramic body are adjacent to rounded corners on the ceramic body.

3. The feed through of claim 1, further comprising:
   a first ceramic ring comprising a brazing surface brazed to the mounting flange; and
   a second ceramic ring comprising a brazing surface brazed to the power source connector.

4. The feed through of claim 1, further comprising a biased conductor which is contained within the central passage of the ceramic body.

5. The feed through of claim 4, wherein the biased conductor comprises a spring which contacts the power source connector and a cylindrical pin which contacts the spring.

6. A feed through for connecting a power source to an electrode in a vacuum chamber, comprising:
   a ceramic body comprising a first brazing surface, a second brazing surface, and a central passage for a conductor, wherein the first and second brazing surfaces are frustoconical;
   a mounting flange brazed to the first brazing surface; and
   a power source connector brazed to the second brazing surface.

7. The feed through of claim 6, wherein the first and second brazing surfaces of the ceramic body are adjacent rounded corners on the ceramic body.

8. The feed through of claim 7, wherein the first and second brazing surfaces of the ceramic body are annular surfaces.

9. The feed through of claim 8, further comprising a biased conductor which is contained within the central passage of the ceramic body.

10. The feed through of claim 9, wherein the biased conductor comprises a spring which contacts the power source connector and a cylindrical pin which contacts the spring.

11. A high voltage feed through for a vacuum processing chamber, comprising:
    a chamber wall comprising a passage between an electrode within a vacuum chamber and ambient pressures;
    a ceramic body comprising a first brazing surface, a second brazing surface, and a central passage for a conductor;
    a mounting flange brazed to the first brazing surface to define a first brazed connection;
    a power source connector brazed to the second brazing surface to define a second brazed connection; and
    a biased conductor which is contained within the central passage of the ceramic body;
    wherein the first and second brazing surfaces are substantially planar.

12. The feed through of claim 11, further comprising:
    a first ceramic ring comprising a brazing surface brazed to the mounting flange; and
    a second ceramic ring comprising a brazing surface brazed to the power source connector.

13. The feed through of claim 11, wherein the biased conductor comprises a spring which contacts the power source connector and a cylindrical pin which contacts the spring.

14. The feed through of claim 11, wherein the first and second brazing surfaces of the ceramic body are adjacent rounded corners on the ceramic body.

15. A high voltage feed through for a vacuum processing chamber, comprising:

a chamber wall comprising a passage between an electrode within a vacuum chamber and ambient pressures;

a ceramic body at least partially disposed within the passage, the ceramic body comprising a first brazing surface, a second brazing surface, and a central passage for a biased conductor;

a mounting flange connected to the passage in the wall and brazed to the first brazing surface;

a first ceramic ring comprising a brazing surface which is brazed to the mounting flange:

a power source connector brazed to the second brazing surface;

a second ceramic ring comprising a brazing surface which is brazed to the power source connector; and a biased conductor which is contained within the central passage of the ceramic body and connects the power source connector to the electrode.

16. The feed through of claim 15, wherein the first and second brazing surfaces of the ceramic body protrude from the ceramic body.

17. The feed through of claim 16, wherein the first and second brazing surfaces are frustoconical.

18. The feed through of claim 16, wherein the first and second brazing surfaces of the ceramic body are substantially planar.

19. The feed through of claim 18, wherein the biased conductor comprises a spring which contacts the power source connector and a cylindrical pin which contacts the spring and the electrode.

20. A feed through for connecting a power source to an electrode in a vacuum chamber, comprising:

a ceramic body comprising a first annular brazing surface, a second annular brazing surface, and a central passage, wherein the first and second annular brazing surfaces are substantially planar and substantially parallel to one another;

a mounting flange brazed to the first annular brazing surface; and a power source connector brazed to the second annular brazing surface.

21. The feed through of claim 20, further comprising:

a first ceramic ring disposed parallel to the first annular brazing surface and comprising a brazing surface brazed to the mounting flange; and a second ceramic ring disposed parallel to the second annular brazing surface and comprising a brazing surface brazed to the power source connector.

22. The feed through of claim 21, wherein the ceramic body further comprises:

a first extension at one end of the ceramic body disposed concentrically through the first ceramic ring; and wherein the first extension is integrally joined to the first annular brazing surface by a rounded corner.

23. The feed through of claim 22, further comprising a biased conductor which is contained within the central passage of the ceramic body, wherein the biased conductor comprises a spring which contacts the power source connector and a cylindrical pin which contacts the spring.

* * * * *